United States Patent
Bouchard et al.

(10) Patent No.: US 7,089,138 B1
(45) Date of Patent: Aug. 8, 2006

(54) CANARY DEVICE FOR FAILURE ANALYSIS

(75) Inventors: Pierre J. Bouchard, Burlington, VT (US); Mark C. Hakey, Fairfax, VT (US); Mark E. Masters, Essex Junction, VT (US); Leah M. P. Pastel, Essex, VT (US); James A. Slinkman, Montpelier, VT (US); David P. Vallett, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/906,590

(22) Filed: Feb. 25, 2005

(51) Int. Cl.
*G06F 11/00* (2006.01)
(52) U.S. Cl. .................. 702/117; 702/118; 700/121
(58) Field of Classification Search ........... 702/117, 702/57–59, 108, 118, 124, 126, 35, 36, 183, 702/185, 189, 81–84; 700/121
See application file for complete search history.

(56) References Cited

U.S. PATENT DOCUMENTS

| | | | |
|---|---|---|---|
| 5,438,527 A | 8/1995 | Feldbaumer et al. | 716/19 |
| 5,485,095 A | 1/1996 | Bertsch et al. | 324/537 |
| 5,899,703 A * | 5/1999 | Kalter et al. | 438/18 |
| 5,936,420 A | 8/1999 | Sotokubo | 324/759 |
| 5,946,545 A | 8/1999 | Bertin et al. | 438/15 |
| 6,121,156 A | 9/2000 | Shamble et al. | 438/734 |
| 6,210,983 B1 | 4/2001 | Atchison et al. | 438/14 |
| 6,518,591 B1 | 2/2003 | Shamble et al. | 257/48 |
| 6,519,193 B1 | 2/2003 | Nakano | 365/200 |
| 6,567,715 B1 * | 5/2003 | Sinclair et al. | 700/110 |
| 6,730,529 B1 | 5/2004 | Kalter et al. | 438/17 |
| 6,797,981 B1 | 9/2004 | Schmidt | 257/48 |
| 2005/0235230 A1 * | 10/2005 | Bohn et al. | 716/1 |

* cited by examiner

*Primary Examiner*—Hal Wachsman
(74) *Attorney, Agent, or Firm*—Gibb I.P. Law Firm, LLC; Robert A. Walsh, Esq.

(57) ABSTRACT

A diagnostic system and method for testing an integrated circuit during fabrication thereof. The diagnostic system has at least one integrated circuit chip that has an electrical signature associated with it; a sacrificial circuit that is adjacent to the integrated circuit chip and has a known electrical signature associated with it and intentionally misdesigned circuitry; and a comparator adapted to compare the electrical signature of the integrated circuit chip with the known electrical signature of the sacrificial circuit, wherein a match in the electrical signature of the integrated circuit chip with the known electrical signature of the sacrificial circuit indicates that the integrated circuit chip is misdesigned. The diagnostic system further includes a semiconductor wafer that has a plurality of integrated circuit chips and a kerf area separating one integrated circuit chip from another integrated circuit chip. A mis-designed integrated circuit chip has abnormally functioning circuitry.

20 Claims, 6 Drawing Sheets

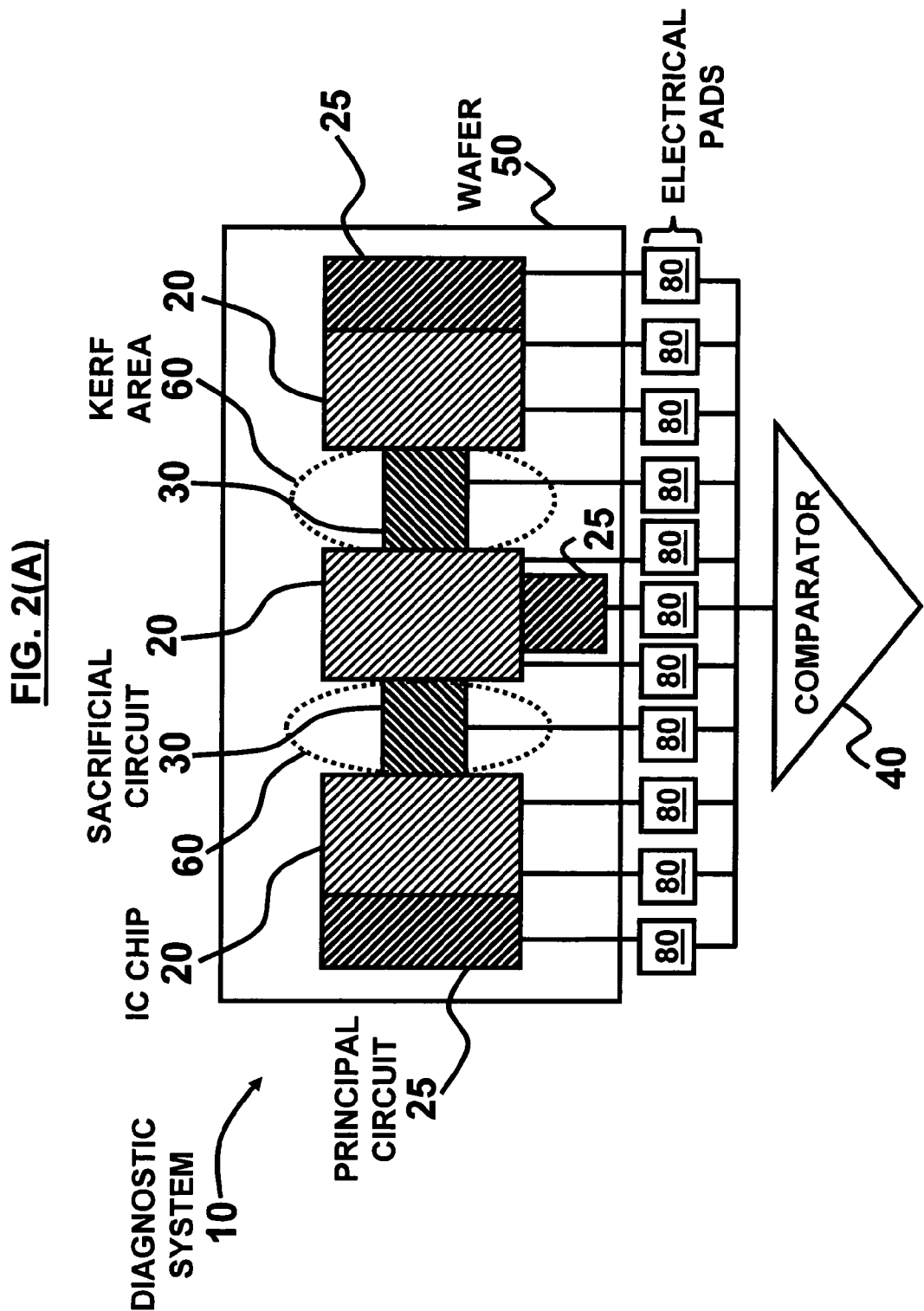

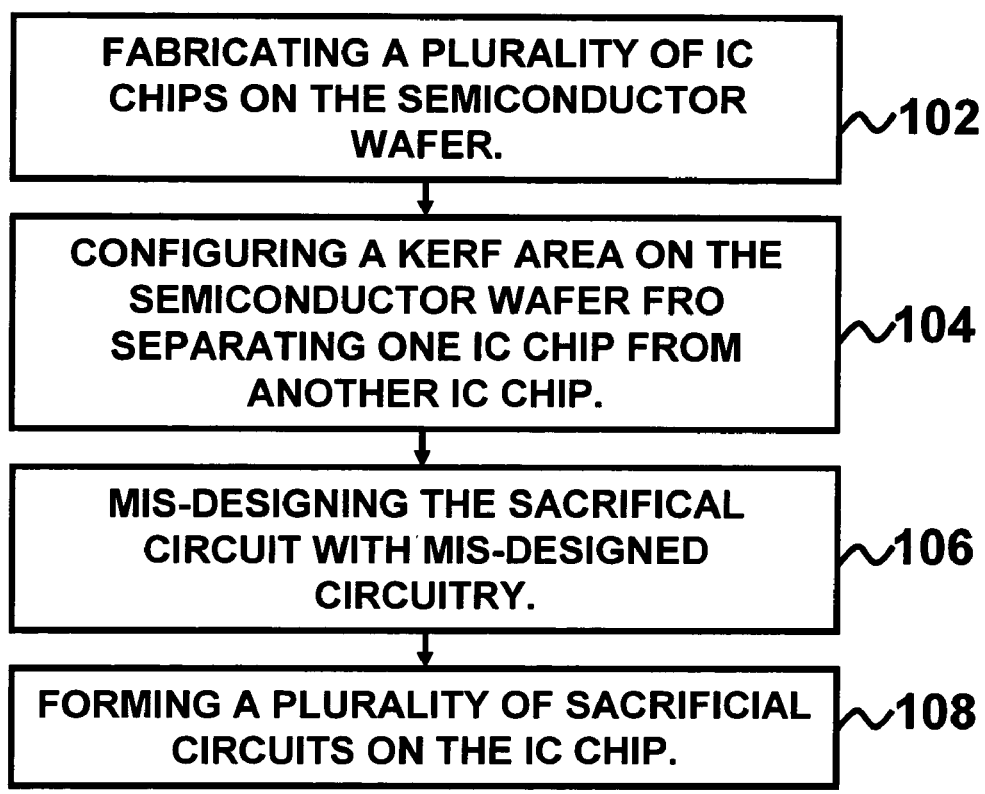

CANARY DEVICE FOR FAILURE ANALYSIS

BACKGROUND OF THE INVENTION

1. Field of the Invention

The embodiments of the invention generally relate to testing and analyzing microelectronic devices, and more particularly to integrated circuit (IC) diagnostic techniques used during IC fabrication and processing.

2. Description of the Related Art

Missing, incorrect, or over/under processing of individual manufacturing steps are common problems in the semiconductor industry, especially when new process technologies are under development. Fast discovery of the root cause(s) of these problems and immediate correction is therefore a key to success in this competitive industry. These mis-processed semiconductor steps (for example, missing halo implant) manifest different device performance characteristics, and are often difficult or even impossible to locate with particularity (i.e., pin point) without exhaustive and expensive failure analysis diagnostic techniques and/or time consuming engineering wafer split lot experiments, which ultimately compare electrical performance of intentionally mis-processed to correctly processed wafers.

The areas between the actual chips on a semiconductor wafer that eventually get destroyed during dicing are called "kerfs" or "streets". Typically, semiconductor manufacturers place easily testable circuit and device structures in the area between individual chips on a wafer (i.e., the "kerf"), but usually such structures are robustly designed, and are tailored to device engineering needs. In addition, these kerf structures receive the identical processing as the entire wafer (correctly or incorrectly), since the kerf is intended to supply device and circuit characteristics to predict the actual chip performance and yield. However, currently the kerf is not designed, intended, and is rarely used as a "diagnostic failure analysis" tool. Manufacturers use the kerf area to place numerous circuits for the purpose of testing and monitoring the health of the processing as the wafers go through the line. Many types of transistors, resistors, capacitors, inductors, and logic and analog circuits thereof are configured to measure myriad parameters like sheet resistance, contact resistance, insulator capacitance, threshold voltage, leakage, defect density, line widths, junction depths, etc. These circuits are wired to relatively large metal pads that are probed by testers at various points during manufacture in a process called "inline test."

The monitor circuits above require that the semiconductor processing be of sufficient quality that the monitors themselves are functional, and able to detect more subtle processing errors. In other words, if entire layers are missing, or significantly out of "spec" (specification), then the circuit cannot monitor normal process variations and subtle problems, and diagnosing these gross errors is made even more difficult.

Without the aid of the monitor circuits, the only known methods for diagnosing the gross errors described above are running expensive and time-consuming experiments in an attempt to duplicate the problem under known processing conditions, and expensive "brute-force" laboratory inspection using high-sensitivity instrumentation in a slow and often dead-end "shotgun" approach.

Moreover, with most current failure analysis techniques and available electrical test information, definitive diagnosis typically cannot be achieved without months of long and costly engineering split lot experiments. Moreover, even then, the engineering split lot experiment selection may be incorrect, thereby yielding unusable diagnostic information, thus requiring additional split lots.

U.S. Pat. No. 6,797,981 ("the '981 patent") incorporated herein by reference uses purposely "designed-in" errors to test semiconductor wafers. However these errors are meant to mimic "random" process defects (foreign material, localized extra or missing shapes) that affect only very small and localized areas of a chip and are detectable using known diagnostic methods. The '981 patent is a way to test those known diagnostic methods in a systematic way. However, when entire levels or process steps are missing in a wafer, all known diagnostic methods are generally rendered useless. Hence, there is a need to allow one to diagnose very gross process errors when entire levels or process steps are missing in a wafer and/or the associated circuitry.

Thus, the conventional techniques generally fail to provide an adequate and timely diagnostic failure analysis/technique. Therefore, there remains a need for a novel inexpensive diagnostic technique used in testing an element of a semiconductor manufacturing process.

SUMMARY OF THE INVENTION

In view of the foregoing, an embodiment of the invention provides a diagnostic system for testing an integrated circuit (IC) during fabrication of the IC, wherein the diagnostic system comprises at least one principal circuit adjacent to the IC chip comprising an electrical signature; a sacrificial circuit adjacent to the IC chip, wherein the sacrificial circuit comprising a known electrical signature; and a comparator adapted to compare the electrical signature of the principal circuit with the known electrical signature of the sacrificial circuit, wherein upon gross failure of the principal circuit a match in the electrical signature of the principal circuit with the known electrical signature of any of the sacrificial circuits indicates that the IC chip was mis-designed or mis-processed in the same manner as the sacrificial circuit was intentionally mis-designed to be mis-processed. The diagnostic system further comprises a semiconductor wafer comprising a plurality of IC chips and a kerf area separating one IC chip from another IC chip. In one embodiment, the sacrificial circuit is located in the kerf area. In another embodiment, the sacrificial circuit is located on each of the plurality of IC chips.

The sacrificial circuit comprises intentionally mis-designed circuitry comprising a defect, which comprises any of missing interconnect levels, extraneous interconnect levels, missing source/drain implants, off-specification source/drain implants, missing well implants, off-specification well implants, deposition errors, etching errors, off-specification polysilicon gate thicknesses, missing silicide, ill-formed silicide, missing contacts, ill-formed contacts, field oxide variations, and one-sided block implants. The diagnostic system further comprises a plurality of sacrificial circuits adjacent to the IC chip. Moreover, a mis-designed IC chip comprises abnormally functioning circuitry and wherein the known electrical signature of the sacrificial circuit is unique compared to an electrical signature of a normally functioning IC chip.

Another aspect of the invention provides a method for testing an IC during fabrication of the IC, wherein the method comprises fabricating at least one IC chip on a semiconductor wafer; forming a principal circuit adjacent to the IC chip; the principal circuit comprising an electrical signature; forming a sacrificial circuit adjacent to the IC chip, the sacrificial circuit comprising a known electrical signature; comparing the electrical signature of the IC chip with the known electrical signature of the sacrificial circuit, wherein a match in the electrical signature of the IC chip with the known electrical signature of the sacrificial circuit indicates that the IC chip is mis-designed. The method further comprises fabricating a plurality of IC chips on the semiconductor wafer; and configuring a kerf area on the semiconductor wafer for separating one IC chip from another IC chip. Additionally, the method includes forming the sacrificial circuit in the kerf area. In an alternative embodiment, the method includes forming the sacrificial circuit on each of the plurality of IC chips.

The method further comprises intentionally mis-designing the sacrificial circuit with mis-designed circuitry, wherein in the mis-designing process, the mis-designed circuitry comprises any of missing interconnect levels, extraneous interconnect levels, missing source/drain implants, off-specification source/drain implants, missing well implants, off-specification well implants, deposition errors, etching errors, off-specification polysilicon gate thicknesses, missing silicide, ill-formed silicide, missing contacts, ill-formed contacts, field oxide variations, and one-sided block implants. Additionally, the method further comprises forming a plurality of sacrificial circuits on the IC chip. According to the embodiments of the invention, a mis-designed IC chip comprises abnormally functioning circuitry. Also, the known electrical signature of the sacrificial circuit is unique compared to an electrical signature of a normally functioning IC chip.

By purposely mis-designing circuits and components (sacrificial circuits (canary devices)) in known ways, one can create electrical signatures that can be matched against normally-designed failing devices on the same wafers during inline test. Thus, when an electrical signature of a principal device (i.e., device to be tested) matches an electrical signature of a sacrificial device, one can conclude that there is a very high probability that the unintentional processing error in the principal device is the same as the intentional mis-designed error in the sacrificial device having the matching electrical signature, thereby saving costly and time-consuming experiments and low-probability failure analysis.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIGS. 2(A) and 2(B) are schematic diagrams of a diagnostic system according to a second embodiment of the invention;

FIG. 5(B) is a flow diagram illustrating another aspect of a preferred method of an embodiment of the invention.

DETAILED DESCRIPTION OF PREFERRED EMBODIMENTS OF THE INVENTION

Figure 1:
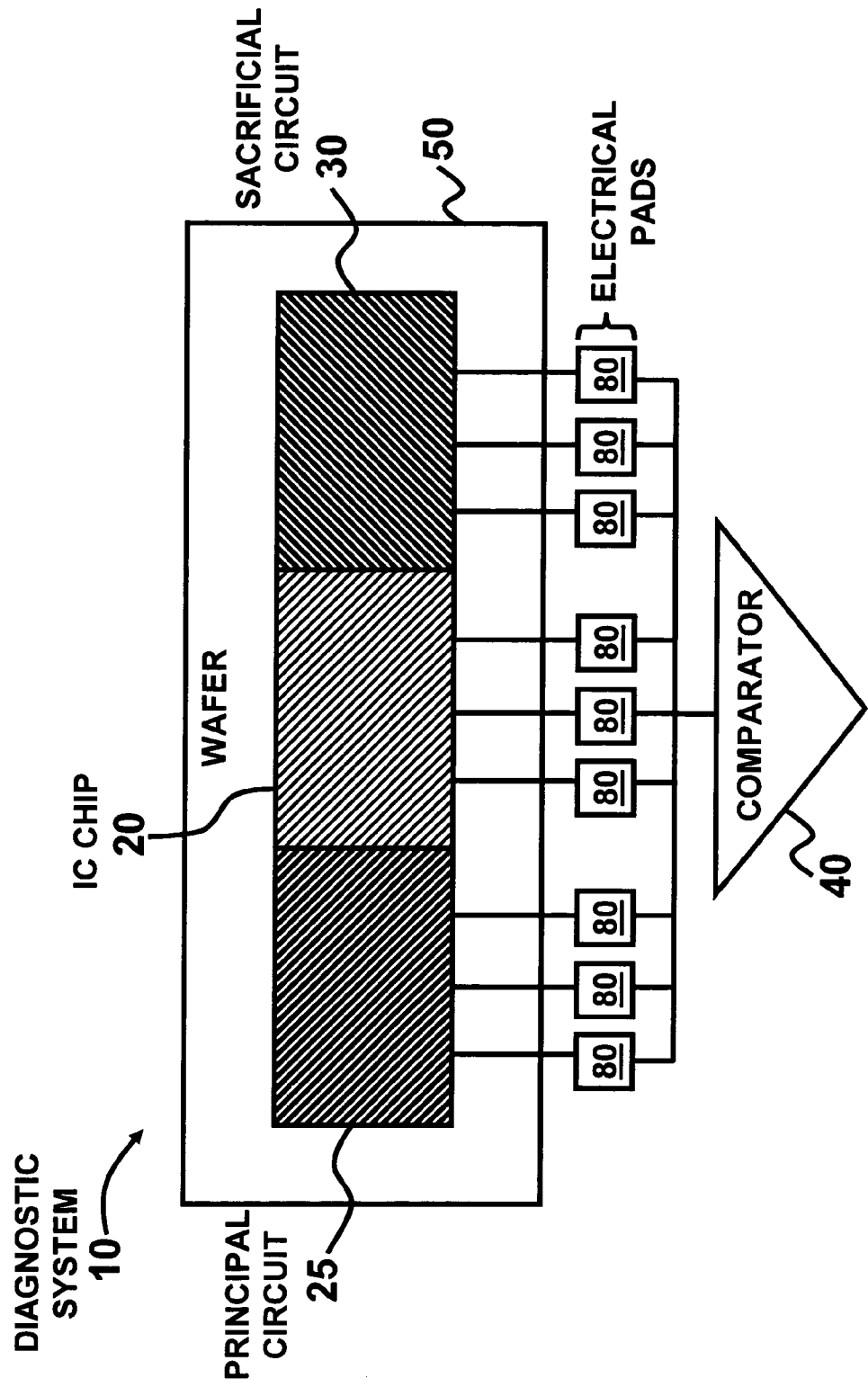
FIG. 1 is a schematic diagram of a diagnostic system according to a first embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a novel inexpensive diagnostic technique used in testing an element of a semiconductor manufacturing process. The embodiments of the invention achieve this by identifying and correcting semiconductor mis-designed fabrication steps in a timely manner. In particular, the embodiments of the invention utilize intentionally mis-designed canary devices (i.e., sacrificial circuits comprising mis-designed circuitry) to detect semiconductor manufacturing problems robustly and quickly. Referring now to the drawings, and more particularly to FIGS. 1 through 5(B) where similar reference characters denote corresponding features consistently throughout the figures, there are shown preferred embodiments of the invention.

Figure 2B:
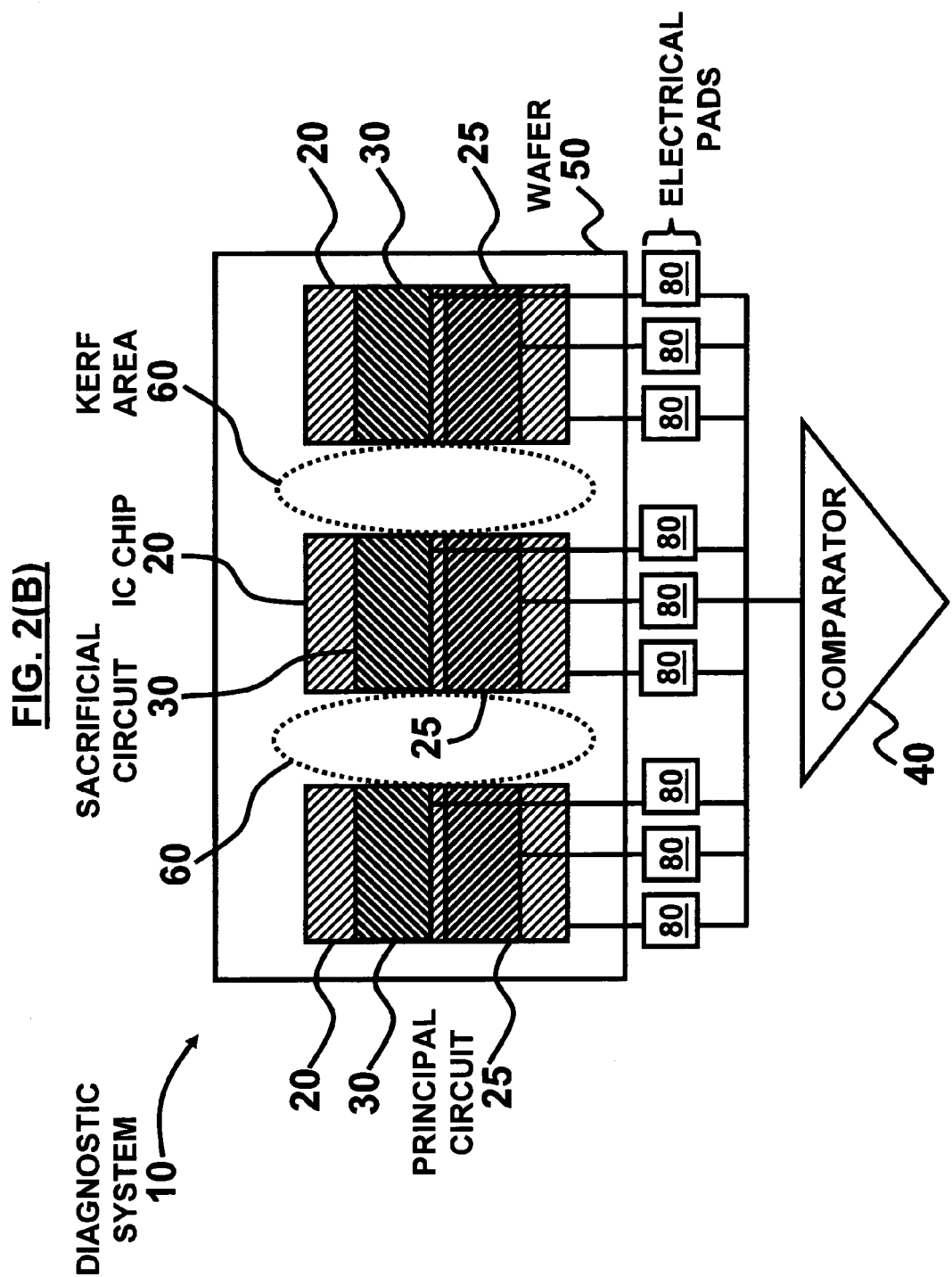
Figure 3:
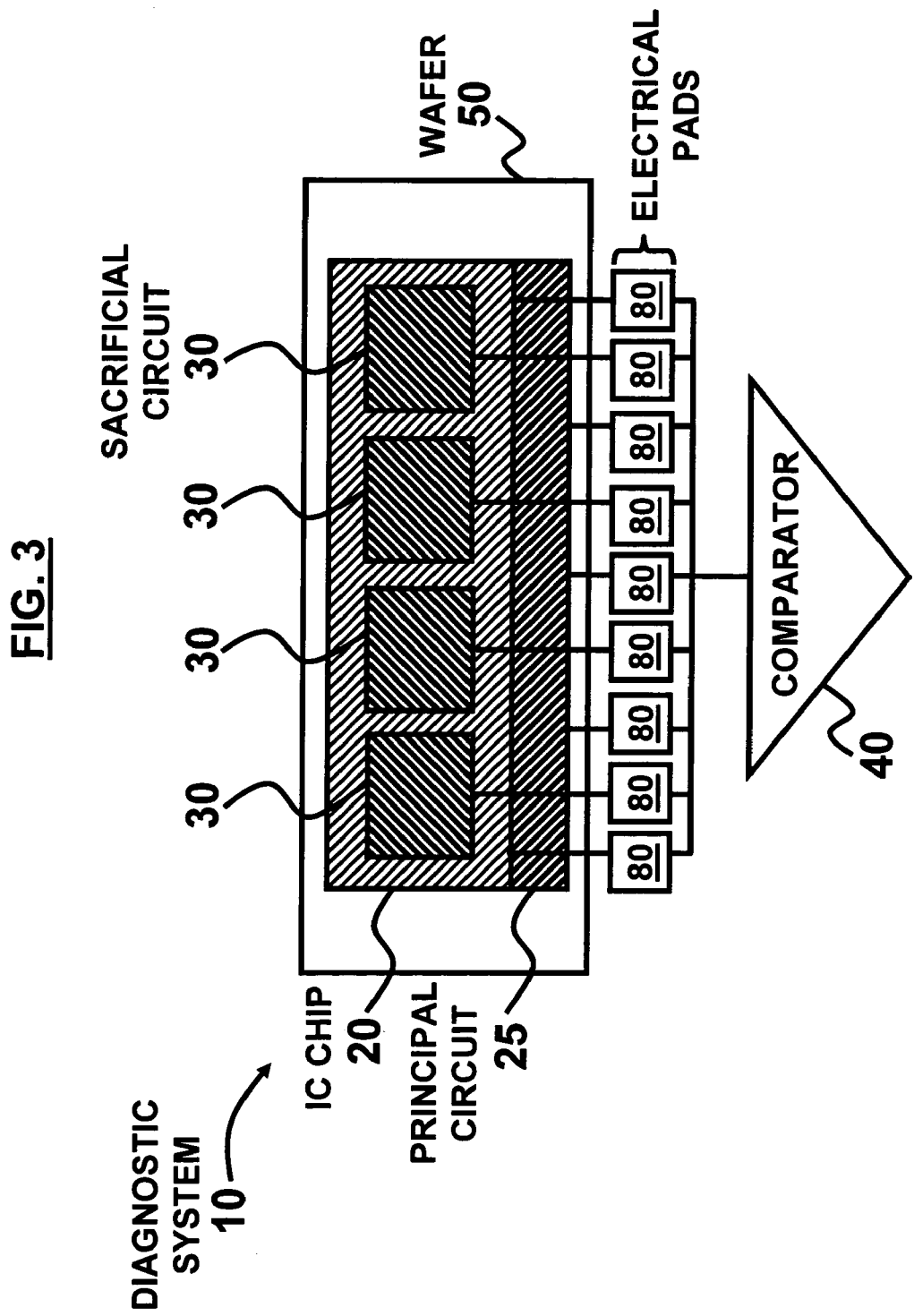
FIG. 3 is a schematic diagram of a diagnostic system according to a third embodiment of the invention.

FIGS. 1 through 3 illustrate several embodiments of a diagnostic system 10 for testing an integrated circuit (IC) during fabrication of the IC, wherein the diagnostic system 10 comprises at least one IC chip 20; at least one principal circuit 25 comprising an electrical signature adjacent to the IC chip 20; a sacrificial circuit 30 adjacent to the IC chip 20, wherein the sacrificial circuit 30 comprises a known electrical signature; and a comparator 40 adapted to compare the electrical signature of the principal circuit 25 with the known electrical signature of the sacrificial circuit 30, wherein a match in the electrical signature of the principal circuit 25 with the known electrical signature of the sacrificial circuit 30 indicates that the IC chip 20 is mis-designed.

FIGS. 2(A) and 2(B) illustrate a second embodiment of the invention where the diagnostic system 10 further comprises a semiconductor wafer 50 comprising a plurality of IC chips 20 and a kerf area 60 separating one IC chip 20 from another IC chip 20. In one embodiment, the sacrificial circuit 30 is located in the kerf area 60, as shown in FIG. 2(A). In another embodiment, the sacrificial circuit 30 is located on each of the plurality of IC chips 20, as shown in FIG. 2(B). The principal circuit 25 may be located anywhere adjacent to the IC chip 20.

The sacrificial circuit 30 comprises intentionally mis-designed circuitry comprising a defect (not shown), whereby the intentionally mis-designed circuitry (not shown) is intentionally incorrectly designed by the semiconductor engineers/technicians. The mis-designed circuitry (not shown) comprises any of missing interconnect levels, extraneous interconnect levels, missing source/drain implants, off-specification source/drain implants, missing well implants, off-specification well implants, deposition errors, etching errors, off-specification polysilicon gate thicknesses, missing silicide, ill-formed silicide, missing contacts, ill-formed contacts, field oxide variations, and one-sided block implants.

For example, the electrical signature of a sacrificial circuit 30 with a missing interconnect level may be different from the electrical signature of a sacrificial circuit 30 with missing well implants, as such each type of mis-designed circuitry (not shown) will have its own unique electrical signature, which will be known to the testing engineers/technicians. Thus, when an IC chip 20 displays a particular electrical signature, it is compared with all of the electrical signatures for the various types of mis-designed circuitry (not shown) until a match is made, which not only identifies that the IC chip 20 contains an error, but also identifies the type of error and where that error is most likely to be in the IC chip 20, thereby isolating error detection, and saving the time and expense of additional testing.

The electrical signatures comprise levels of voltage, current, resistance, capacitance, or inductance levels, in specific combinations, such that levels measured on a sacrificial or canary device 30 that match levels measured on a principal circuit 25 on the IC chip 20 are indicative of the root cause of failure on the principal circuits 25. For example, a principal device 25 with a missing source/drain implant would have a source/drain resistance that matches that of a sacrificial or canary device 30 with an intentionally missing source/drain implant, thereby implicating the missing source/drain implant as the root cause of failure of the principal device 25.

As shown in the third embodiment of FIG. 3, the diagnostic system 10 further comprises a plurality of sacrificial circuits 30 on the IC chip 20. Moreover, a mis-designed IC chip comprises abnormally functioning circuitry and wherein the known electrical signature of the sacrificial circuit is unique compared to an electrical signature of a normally functioning IC chip. Accordingly, the third embodiment of the invention allows for the configuration of the sacrificial device 30 in "free-unused" areas within a functional IC chip 20 and to then test the IC chip 20 whenever needed. Thus, the sacrificial device 30 is always present but has no impact on the performance of the IC chip 20, if not needed.

The principal circuit 25 and sacrificial circuit 30 as implemented in the several embodiments of the invention result in no change or impact to the current wafer 50, IC chip 20, and kerf 60 structure, area processing, performance, etc. in any way. Rather, the sacrificial circuit 30 (also referred to herein as a canary device) provides a diagnostic standard with which to compare (with the principal circuit 25) the functionality IC chip 20 in terms of performance processing.

As mentioned, the sacrificial devices 30 are placed adjacent to the principal circuits 25, and are designed exactly the same as the principal circuit 25, with the exception of one or more intentional mis-designed levels (for example, blocked halo implants within the sacrificial device 30). The principal circuits 25 are normal in that they are not intentionally mis-designed or mis-processed during design/manufacturing. However, it is possible that the principal circuits 25 will contain errors therein, which is the reason why the sacrificial devices 30 are used as a barometer to compare its known electrical characteristics with the electrical characteristics of the principal circuits 25 for the purposes of diagnosing that an error exists in the principal circuits 25 and exactly what and where those errors are and/or are likely to be. In addition, both the sacrificial devices 30 and the principal circuits 25 have the capability of being wired to the same electrical pads 80 (shown in FIGS. 1 through 3) at M1 testing, depending on the M1 (first metallization—i.e., bitline) mask 75 (shown in FIG. 4) that is selected at M1 lithography.

During standard processing of a wafer 50 through the semiconductor manufacturing line, the principal circuit 25 and sacrificial devices 30 are adjacent to one another and are exposed to identical processing. The only differentiation would be the intentional mis-processing designed into the sacrificial device 30. Preferably, both the sacrificial device 30 and principal circuit 25 are configured on each wafer 50 in the manufacturing line to assure testing is completed on all devices. According to one aspect of the invention, both devices (principal circuit 25 and sacrificial device 30) could be manually probe tested since they both exist on every kerf 60, on every wafer 50 (some test pad isolation work may be necessary with tools such as Focused Ion Beam (FIB) or laser etc.).

As implemented, when a non diagnosable problem arises in the line, the very next lot into M1 could be used as a failure analysis diagnostic tool. Some wafers from that lot would be selected to use the FA M1 mask to make the sacrificial devices 30 wired to the M1 electrical pads 80 for testability for Failure Analysis (FA) purposes (for example, if the wafers 50 actually missed the halo implant, then the electrical performance of the sacrificial device 30 would be identical to the electrical performance of the principal circuit device 25). As further implemented, the sacrificial device 30 could be used as an FA line monitor while product development was ongoing.

Figure 4:
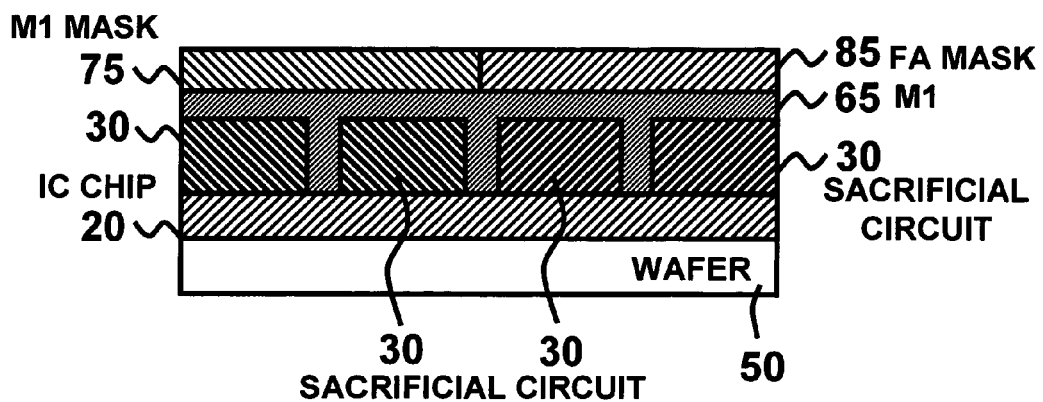
FIG. 4 is a schematic diagram of an implementation of the diagnostic systems of FIGS. 1 through 3 at a wafer level according to an embodiment of the invention.

Additionally, as illustrated in FIG. 4, the several embodiments of the invention may be implemented for "at the wafer level" diagnostic purposes, where one individual wafer 50 and M1 65 is selected, and approximately one-half of the IC chips 20 on the wafer 50 are exposed with a standard M1 mask 75 with the other half of the IC chips 20 being exposed with a canary FA mask 85. This would eliminate any wafer to wafer differences or confusion because no two wafers are identical. Each wafer can be slightly, or greatly different than the next. If one half of the chips on a wafer are exposed with the standard M1 mask 75, and the other half with a canary FA mask 85, any wafer to wafer differences can be ruled out. Furthermore, if a given technology photomask 75 has multiple IC chips 20 and multiple kerfs 60 (per exposure), then one could replace a standard kerf 60 with the sacrificial device 30, which would place the sacrificial device 30 adjacent to the IC chip 20 (similar to the embodiment shown in FIG. 1).

Figure 5A:
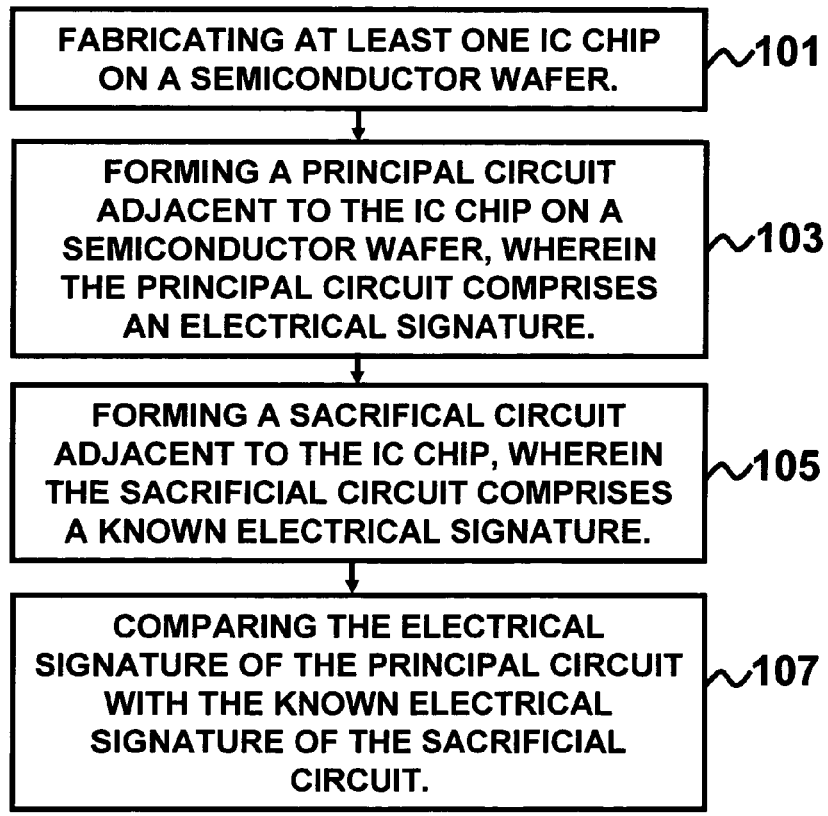
FIG. 5(A) is a flow diagram illustrating a preferred method of an embodiment of the invention.

FIGS. 5(A) and 5(B), which refer to components described in FIGS. 1 through 4, illustrates another aspect of the invention. FIGS. 5(A) and 5(B) illustrate flowcharts of a method for testing an integrated circuit during fabrication of the integrated circuit, wherein the method, as shown in FIG. 5(A), comprises fabricating (101) at least one IC chip 20 on a semiconductor wafer 50; forming (103) a principal circuit 25 adjacent to the IC chip 20, wherein the principal circuit 25 comprises an electrical signature; forming (105) a sacrificial circuit 30 adjacent to the IC chip 20, wherein the sacrificial circuit 30 comprises a known electrical signature; comparing (107) the electrical signature of the principal circuit 25 with the known electrical signature of the sacrificial circuit 30, wherein upon gross failure of the principal circuit 25, a match in the electrical signature of the principal circuit 25 with the known electrical signature of any of the sacrificial circuits 30 indicates that the IC chip 20 was mis-designed in the same manner as the sacrificial circuit 30 was intentionally designed to be mis-designed.

As shown in FIG. 5(B), the method further comprises fabricating (102) a plurality of IC chips 10 on the semiconductor wafer 50 and configuring (104) a kerf area 60 on the semiconductor wafer 50 for separating one IC chip 10 from another IC chip 10. In a first embodiment, the method comprises forming the sacrificial circuit 30 in the kerf area 60. In a second embodiment, the method comprises forming the sacrificial circuit 30 on each of the plurality of IC chips 10.

Moreover, the method further comprises intentionally mis-designing (106) the sacrificial circuit 30 with mis-designed circuitry (not shown), wherein in the step of mis-designing (106), the mis-designed circuitry (not shown) comprises any of missing interconnect levels, extraneous interconnect levels, missing source/drain implants, off-specification source/drain implants, missing well implants, off-specification well implants, deposition errors, etching errors, off-specification polysilicon gate thicknesses, missing silicide, ill-formed silicide, missing contacts, ill-formed contacts, field oxide variations, and one-sided block implants. Additionally, the method further comprises forming (108) a plurality of sacrificial circuits 30 on the IC chip 20. In the step of comparing (107), a mis-designed IC chip comprises abnormally functioning circuitry. Also, in the step of forming (105), the known electrical signature of the sacrificial circuit 30 is unique compared to an electrical signature of a normally functioning principal circuit 25. That is, a mis-designed IC chip comprises abnormally functioning circuitry and wherein the known electrical signature of the sacrificial circuit 30 is unique to the nature of the specific mis-designing. Thus, the known electrical signature of the sacrificial circuit 30 is compared with the electrical signature of a non-functioning IC chip principal circuit 25 to diagnose the nature of the mis-designing.

Generally, the embodiments of the invention provide the implementation of sacrificial "canary" devices 30, which appear identical to existing devices 25 in an integrated circuit 20 with the exception of intentionally mis-designed elements in the sacrificial devices 30. During testing, one particular device 25 may exhibit a failing characteristic. By comparing the electrical signature of the mis-designed sacrificial device 30 with the electrical characteristic of the failing device 25, one would significantly (if not directly) identify the cause of failure. Several implementations exist for the various embodiments of the invention including using floating sacrificial devices 30 with a custom wiring mask 85 when needed; using smaller, internal probe pads 80 for the sacrificial devices 30, and active pad-switching. Isolating interconnecting metal layers allows for different devices to be connected to the probe pads 80 at different points in the process. One device can be connected to a probe pad 80 at a first level of metal and another device can connect to the same pad at a second level of metal.

By purposely mis-designing/mis-processing circuits and components (sacrificial circuits (canary devices) 30) in known ways, one can create electrical signatures that can be matched against normally-designed failing devices on the same wafers 50 during inline test. Thus, when an electrical signature of a principal device 25 (i.e., the device to be tested) matches an electrical signature of a sacrificial device 30, one can conclude that there is a very high probability that the unintentional processing error in the principal device 25 is the same as the intentional mis-designed error in the sacrificial device 30 having the matching electrical signature, thereby saving costly and time-consuming experiments and low-probability failure analysis.

As previously mentioned, when entire levels or process steps are missing in a wafer, all known conventional diagnostic methods are generally rendered useless. Hence, there is a need to allow one to diagnose very gross process errors when entire levels or process steps are missing in a wafer and/or the associated circuitry. As such, the embodiments of the invention address this need by allowing one to diagnose very gross process errors by including purposely mis-designed circuits that mimic these gross process errors to create electrical comparison signatures.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the embodiments of the invention can be practiced with modification within the spirit and scope of the appended claims.

What is claimed is:

1. A diagnostic system for testing an integrated circuit (IC) during fabrication of said IC, said diagnostic system comprising:
   at least one IC chip;
   at least one principal circuit comprising an electrical signature adjacent to said at least one IC chip;
   a sacrificial circuit adjacent to said at least one IC chip, said sacrificial circuit comprising a known electrical signature; and
   a comparator adapted to compare said electrical signature of said principal circuit with said known electrical signature of said sacrificial circuit, wherein a match in said electrical signature of said principal circuit with said known electrical signature of said sacrificial circuit indicates that said at least one IC chip is mis-designed.

2. The diagnostic system of claim 1, further comprising:
   a semiconductor wafer comprising a plurality of IC chips; and
   a kerf area separating one IC chip from another IC chip.

3. The diagnostic system of claim 2, wherein said sacrificial circuit is located in said kerf area.

4. The diagnostic system of claim 2, wherein said sacrificial circuit is located on each of said plurality of IC chips.

5. The diagnostic system of claim 1, wherein said sacrificial circuit comprises intentionally mis-designed circuitry comprising a defect.

6. The diagnostic system of claim 5, wherein said intentionally mis-designed circuitry comprises any of missing interconnect levels, extraneous interconnect levels, missing source/drain implants, off-specification source/drain implants, missing well implants, off-specification well implants, deposition errors, etching errors, off-specification polysilicon gate thicknesses, missing silicide, ill-formed silicide, missing contacts, ill-formed contacts, field oxide variations, and one-sided block implants.

7. The diagnostic system of claim 1, further comprising a plurality of sacrificial circuits adjacent to said at least one IC chip.

8. The diagnostic system of claim 1, wherein a mis-designed IC chip comprises abnormally functioning circuitry.

9. The diagnostic system of claim 1, wherein said known electrical signature of said sacrificial circuit is unique compared to an electrical signature of a normally functioning IC chip.

10. A system for testing microelectronic devices during manufacturing of said microelectronic devices, said system comprising:
   a semiconductor wafer;
   at least one integrated chip (IC) on said semiconductor wafer, said at least one IC chip comprising a principal circuit having an electrical performance associated with it;
   a kerf area separating one IC chip from another IC chip;
   at least one sacrificial device on any of said at least one IC chip and said kerf area, wherein said at least one sacrificial device has a known electrical performance associated with it and comprises intentionally mis-designed circuitry;
   a comparator adapted to compare said electrical performance of said principal circuit with said known electrical performance of said at least one sacrificial device,
   wherein a match in said electrical performance of said principal circuit with said known electrical performance of said at least one sacrificial device indicates that said at least one IC chip is mis-designed, and
   wherein a mis-designed IC chip comprises abnormally functioning circuitry.

11. The system of claim 10, wherein said intentionally mis-designed circuitry comprises any of missing interconnect levels, extraneous interconnect levels, missing source/drain implants, off-specification source/drain implants, missing well implants, off-specification well implants, deposition errors, etching errors, off-specification polysilicon gate thicknesses, missing silicide, ill-formed silicide, missing contacts, ill-formed contacts, field oxide variations, and one-sided block implants.

12. A method for testing an integrated circuit (IC) during fabrication of said IC, said method comprising:
   fabricating at least one IC chip on a semiconductor wafer;
   forming a principal circuit adjacent to said at least one IC chip; said principal circuit comprising an electrical signature;
   forming a sacrificial circuit adjacent to said at least one IC chip, said sacrificial circuit comprising a known electrical signature;
   comparing said electrical signature of said principal circuit with said known electrical signature of said sacrificial circuit, wherein a match in said electrical signature of said principal circuit with said known electrical signature of said sacrificial circuit indicates that said at least one IC chip is mis-designed.

13. The method of claim 12, further comprising:
   fabricating a plurality of IC chips on said semiconductor wafer; and
   configuring a kerf area on said semiconductor wafer for separating one IC chip from another IC chip.

14. The method of claim 13, wherein the process of forming said sacrificial circuit comprises forming said sacrificial circuit in said kerf area.

15. The method of claim 13, wherein the process of forming said sacrificial circuit comprises forming said sacrificial circuit on each of said plurality of IC chips.

16. The method of claim 12, further comprising intentionally mis-designing said sacrificial circuit with mis-designed circuitry comprising defects.

17. The method of claim 16, wherein in the mis-designing process, said mis-designed circuitry comprises any of missing interconnect levels, extraneous interconnect levels, missing source/drain implants, off-specification source/drain implants, missing well implants, off-specification well implants, deposition errors, etching errors, off-specification polysilicon gate thicknesses, missing silicide, ill-formed silicide, missing contacts, ill-formed contacts, field oxide variations, and one-sided block implants.

18. The method of claim 12, further comprising forming a plurality of sacrificial circuits on said at least one IC chip.

19. The method of claim 12, wherein in the comparing process, a mis-designed IC chip comprises abnormally functioning circuitry.

20. The method of claim 12, wherein in said forming of said sacrificial circuit, said known electrical signature of said sacrificial circuit is unique compared to an electrical signature of a normally functioning IC chip.

* * * * *